(12) United States Patent
Bednara et al.

(10) Patent No.: US 7,175,313 B2
(45) Date of Patent: Feb. 13, 2007

(54) LOCKING ASSEMBLY FOR BALLAST HOUSING

(75) Inventors: Matthew Raymond Bednara, Collinsville, IL (US); Subodh Kumar Ghildyal, Chesterfield, MO (US)

(73) Assignee: Hubbell Incorporated, Orange, CT (US)

( * ) Notice: Subject to any disclaimer, the term of this patent is extended or adjusted under 35 U.S.C. 154(b) by 256 days.

(21) Appl. No.: 10/793,935

(22) Filed: Mar. 8, 2004

(65) Prior Publication Data

US 2005/0205576 A1 Sep. 22, 2005

(51) Int. Cl.
*B65D 45/30* (2006.01)

(52) U.S. Cl. ............... 362/265; 362/374; 361/674; 292/256.75; 220/315; 220/2.8

(58) Field of Classification Search ........... 362/263, 362/265, 154, 362, 374, 375; 206/477; 220/3.8, 220/324, 242, 315; 174/67; 292/256.75, 292/58; 361/674; 49/381, 383, 394
See application file for complete search history.

(56) References Cited

U.S. PATENT DOCUMENTS

| | | | |
|---|---|---|---|
| 854,045 A | 5/1907 | La Paugh | |
| 2,557,952 A * | 6/1951 | Dumont | ...................... 222/387 |
| 3,140,344 A | 7/1964 | Slater | |
| 3,666,134 A | 5/1972 | Rauch | |
| 4,381,063 A | 4/1983 | Leong | |
| 4,470,623 A | 9/1984 | Judge, Jr. | |
| 4,620,061 A | 10/1986 | Appleton | |
| 4,719,540 A | 1/1988 | San George | |
| 4,850,014 A | 7/1989 | Gillis | |
| 5,228,584 A | 7/1993 | Williams, Jr. | |
| 5,477,442 A * | 12/1995 | Self | ........................... 362/368 |
| 5,731,544 A | 3/1998 | Burck | |
| 6,007,353 A | 12/1999 | Webster | |

* cited by examiner

*Primary Examiner*—Thomas M. Sember
(74) *Attorney, Agent, or Firm*—Roylance, Abrams, Berdo & Goodman, L.L.P.; Alfred N. Goodman (57) ABSTRACT

A locking assembly for a ballast housing simply and easily locks a lid to a body of the housing. The body has a first base and a first wall extending upwardly from the first base. The lid has a second base and a second wall extending downwardly from the second base. A tab extends outwardly from the first wall. A fastener is pivotally disposed in an opening in the tab, and has a head adapted to receive a rotating device. A third base extends outwardly from the second wall. A slot in the third base is adapted to receive the fastener. A nut is threadably disposed on the fastener and the fastener is rotatable through the nut to engage the fastener head with the tab and to engage the nut with the base to tightly secure the lid to the body.

36 Claims, 5 Drawing Sheets

LOCKING ASSEMBLY FOR BALLAST HOUSING

FIELD OF THE INVENTION

The present invention relates to a locking assembly for a ballast housing. More particularly, the present invention relates to a locking assembly for a ballast housing having a pivotable fastener secured to a body of the housing and a slot adapted to receive the fastener in a lid. Still more particularly, the present invention relates to a fastener on a body of a ballast housing pivotable into a slot in a lid of the housing, and a nut on the fastener, the fastener being rotated to move the nut and to tightly seal the lid to the body.

BACKGROUND OF THE INVENTION

Ballast tank housings for lighting assemblies are typically used in harsh or hazardous locations, as well as in standard location areas that may require "heavy-duty" lighting assemblies. The ballast tank housings protect the enclosed ballast from the detrimental and deteriorating effects of moisture, dirt, dust, corrosion, vibration, wind, water, snow, and other various foreign matter and harsh environmental conditions in which the lighting assemblies are used. Therefore, such lighting assemblies are ideal for use in manufacturing plants, chemical and petrochemical processing facilities, sewage treatment plants, off-shore and dockside installation, garages and storage facilities, as well as other industrial locations where protecting the housed ballast is desired.

One problem with most existing ballast tank housings is that an installer must support the ballast tank while attempting to thread a fastener from the ballast tank into the splice box. The installer must align fastener holes in both the splice box (lid) of the ballast tank housing and the body portion of the housing to be able to thread a fastener between the splice box and body. This task is made even more difficult when the installer must use a ladder to mount the lighting assembly to a support. A need exists for a locking assembly in which securing the lid to the body of the ballast housing is a simple and easy task.

Another problem with existing ballast tank housings for lighting assemblies is that either special tools are required to secure the lid to the body of the ballast tank housing, or the weight of body must be supported while trying to securely fasten the lid to the body. In the case of configurations requiring the weight of the tank to be supported, the installer must simultaneously attempt to start a screw into the lid, which is a difficult task as tank housings can weigh up to 45 pounds and are often installed in awkward locations. Existing locking assemblies are difficult or impossible to completely seal with tools generally carried by installers, such as a standard socket wrench or screwdriver. Due to the configuration of existing locking assemblies special tools are required, such as a deep socket wrench, that are not generally carried by the installer. Thus, an installer must ensure he has the proper special tools required to finish the installation, or the installation cannot be completed until the installer obtains the required special tools. This results in a difficult, time consuming and inefficient installation process. A need exists for a locking assembly for a ballast tank housing that does not require special tools to be installed, thereby saving time and money during the installation process.

Still another problem with some existing ballast tank housings for lighting assemblies is that the bolt of the locking assembly is fixed to the ballast tank housing, thereby preventing it from being rotated. Since the bolt cannot be rotated, the locking assembly can only be completely fastened by rotating a nut received on the fastener. As discussed above, some bolts are extremely long and standard socket wrenches bottom out before the locking assembly is completely fastened, thereby requiring a repeat trip by the installer with a deep socket wrench or a much slower box wrench to complete the fastening of the locking assembly. Also, many standard tools, such as screwdrivers and nutdrivers, cannot be used to fasten the locking assembly. Therefore, a need exists for a locking assembly that is quickly and easily fastened using standard tools.

Examples of existing locking assemblies are disclosed in the following U.S. Pat. No. 3,666,134 to Rauch; U.S. Pat. No. 4,470,623 to Judge, Jr.; and U.S. Pat. No. 4,719,540 to San George et al.

A need exists for an improved locking assembly for a ballast tank housing.

SUMMARY OF THE INVENTION

Accordingly, it is a primary objective of the present invention to provide an improved locking assembly.

Accordingly, another objective of the present invention is to provide a locking assembly for a ballast housing that is quick and easy to install, thereby providing an efficient installation process.

Accordingly, another objective of the present invention is to provide a locking assembly that does not require special tools to install, thereby providing a simple installation process.

Accordingly, another object of the present invention is to provide a locking assembly that does not require supporting the ballast tank housing during installation.

The foregoing objects are basically attained by providing a locking assembly, including a body having a first base and a first wall extending upwardly from the first base; a lid having a second base and a second wall extending downwardly from the second base; a tab extending outwardly from the first wall; a fastener pivotally disposed in an opening in the tab; a third base extending outwardly from the second wall; a slot in the third base adapted to receive the fastener; and a nut threadably disposed on the fastener and the fastener being rotatable through the nut to engage the fastener head with the tab and to engage the nut with the base to tightly secure the lid to the body.

Other objects, advantages and salient features of the invention will become apparent from the following detailed description, which, taken in conjunction with the annexed drawings, discloses a preferred embodiment of the invention.

BRIEF DESCRIPTION OF THE DRAWINGS

Referring now to the drawings that form a part of the original disclosure.

DETAILED DESCRIPTION OF THE INVENTION

As shown in FIGS. 1–15, a locking assembly 13 for a ballast tank housing 11 simply and easily fastens a lid 21 to a body 31 of the ballast tank housing. The body 31 has a first base 33 and a first wall 35 extending upwardly from the first base. The lid 21 has a second base 23 and a second wall 25 extending downwardly from the second base. A tab 41 extends outwardly from the first wall 35. A fastener 51 is pivotally disposed in-an opening 43 in the tab 41. First and second ears 61 and 62 extend outwardly from the second wall 25. A third base 63 extends between the first and second ears 61 and 62, respectively. A slot 64 in the third base 63 is adapted to receive the fastener 51. A nut 71 is movably disposed on the fastener and is movable to a position adjacent the third base 33 to tightly secure the lid 21 to the body 31.

Figure 1:
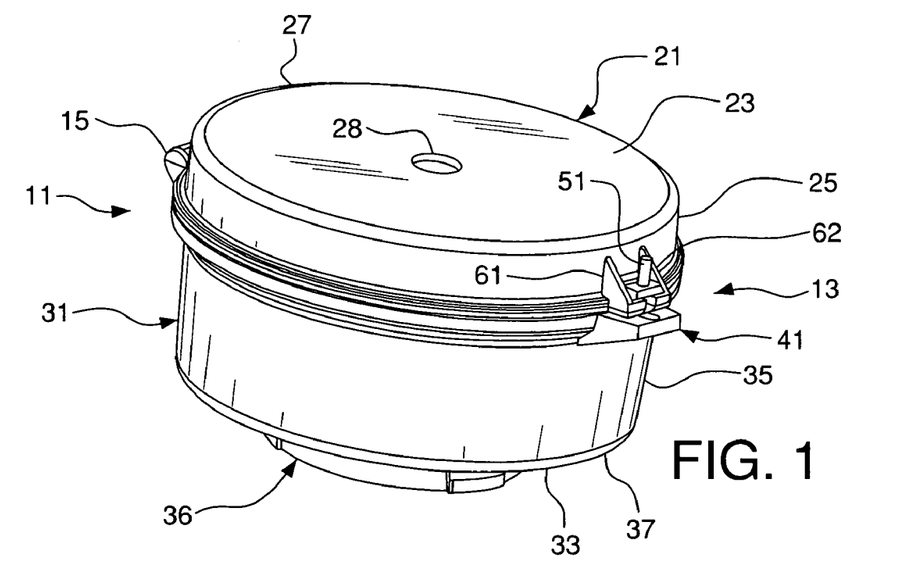
FIG. 1 is a perspective view of a ballast housing in which a lid is secured to a body of the housing with a locking assembly of the present invention.

The ballast tank housing 11 has a lid (splice box or mounting hood) 21 and a body 31, as shown in FIG. 1. Preferably, the body and lid of the ballast housing are made of corrosion resistant copper-free aluminum alloy. A pivotal member 15 connects the lid 21 to the body 31, thereby allowing the lid to be lifted and closed as necessary to access the contents in the cavity 12 of the ballast tank housing 11, such as the ballast. Preferably, the pivotal member 15 is a hinge, but any suitable connection may be used between the lid 21 and body 31. The locking assembly 13 tightly and securely fastens and seals the lid 21 to the body 31, and may be easily disengaged to open the lid. Preferably, the locking assembly 13 is opposite the pivotal member 15, as shown in FIG. 1.

The body 31 of the ballast tank housing 11 has a first base 33, as shown in FIG. 1. A first wall 35 extends upwardly from the first base 33. Preferably, the first base 33 is substantially circular and the first wall 35 extends substantially perpendicularly upwardly from an outer edge 37 of the first base. A groove 39 may be disposed in a first end 38 of the first wall 35 that is adapted to receive a gasket 17 to facilitate a watertight seal between the lid 21 and body 31 of the ballast tank housing 11. Connecting member 36 may be adapted to receive a lamp, a reflector and/or a lamp guard.

The lid (splice box) 21 of the ballast tank housing 11 has a second base 23, as shown in FIG. 1. A second wall 25 extends downwardly from the second base 23. Preferably, the second base 23 is substantially circular and the second wall 25 extends substantially perpendicularly downwardly from an outer edge 27 of the second base. Typically, the lid 21 has means for mounting the ballast tank housing 11 to a support. The lid 21 shown in FIG. 1 is of the "pendant" type, and has an opening 28 adapted to receive a hanger to mount the ballast tank housing 11 to a support (not shown).

Figure 6:
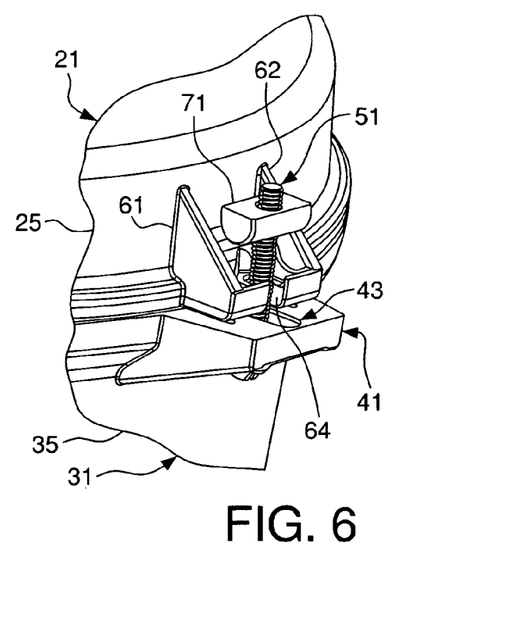
FIG. 6 is a perspective view of the locking assembly in which the fastener has been pivoted into a receiving slot in the lid.
Figure 7:
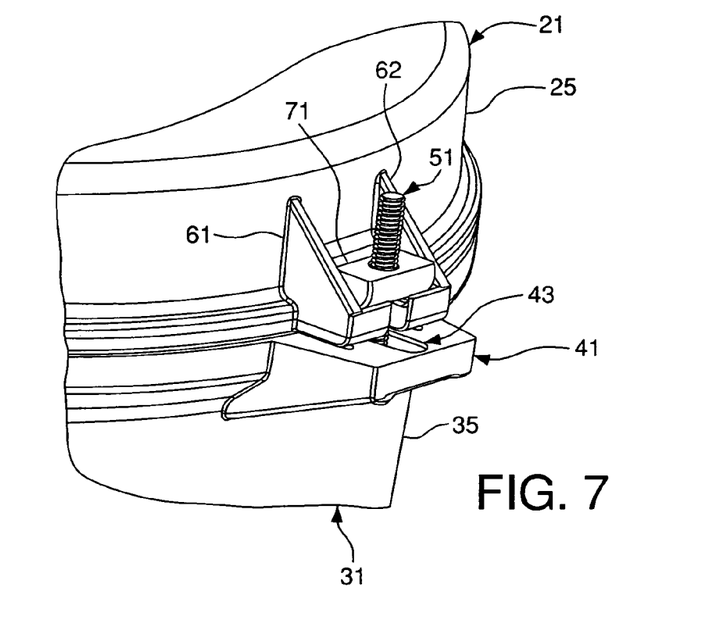
FIG. 7 is a perspective view of the locking assembly in which the lid has been secured to the body of the housing.
Figure 8:
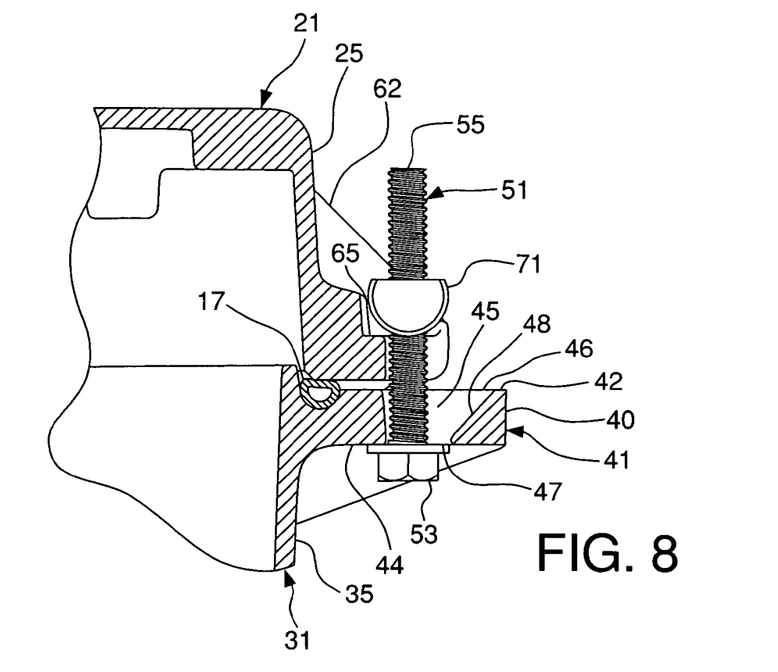
FIG. 8 is an elevational view in cross section of the locking assembly of FIG. 7.

A tab 41 extends outwardly from the first wall 35 of the body 31 of the ballast tank housing 11, as shown in FIGS. 1–9. The tab 41 has an opening 43 to receive the fastener 51. Preferably, the tab 41 has an upper surface 42 and a lower surface 44 between which the opening 43 extends. A passageway 45 extends between an upper opening 46 in the upper surface 42 and a lower opening 47 in the lower surface 44. As shown in FIG. 8, the upper opening 46 is larger than the lower opening 47. At least a portion 48 of an inner wall 49 of the passageway 45 tapers inwardly from the upper opening 46 to the lower opening 47. Preferably, the tapered portion 48 of the inner wall 49 is adjacent a first end 40 of the tab 41 to facilitate pivoting of the fastener 51 within the opening 43. Preferably, the angle of the tapered portion 48 is approximately 25 degrees.

A fastener 51 is passed through the opening 43 in the tab 41, as shown in FIGS. 1–9. The fastener 51 has a head member 53 and a body portion 55. The head member 53 is wider than the width of the lower opening 47 to prevent the fastener 51 from being inserted completely through the opening. The head member 53 abuts the lower surface 44 to prevent further movement of the fastener through the lower opening 47, as shown in FIG. 8. Preferably, the body portion 55 of the fastener 51 is threaded to facilitate receiving the nut 71. The nut 71 is larger than the width of the upper opening 46 to prevent the fastener 51 from being removed through the opening 43 when the lid 21 is in the open position. The fastener 51 is rotatable in the opening 43 in the tab 41.

A nut 71 is received by the body portion 55 of the fastener 51, as shown in FIGS. 1–9. An opening 75 in the nut receives the body portion 55 of fastener 51. Preferably, the opening 75 is internally threaded to facilitate movement of the nut 71 along the threaded body portion 55 of the fastener 51. When the fastener 51 is received by the slot 64 of the lid 21, the fastener 51 is rotated upwardly through the nut 71 to tightly secure the lid to the body 31 of the ballast tank housing 11. Once the lid 21 is secured to the body 31, the fastener 51 is rotated downwardly through the nut 71 to loosen the connection between the lid and body.

Figure 9:
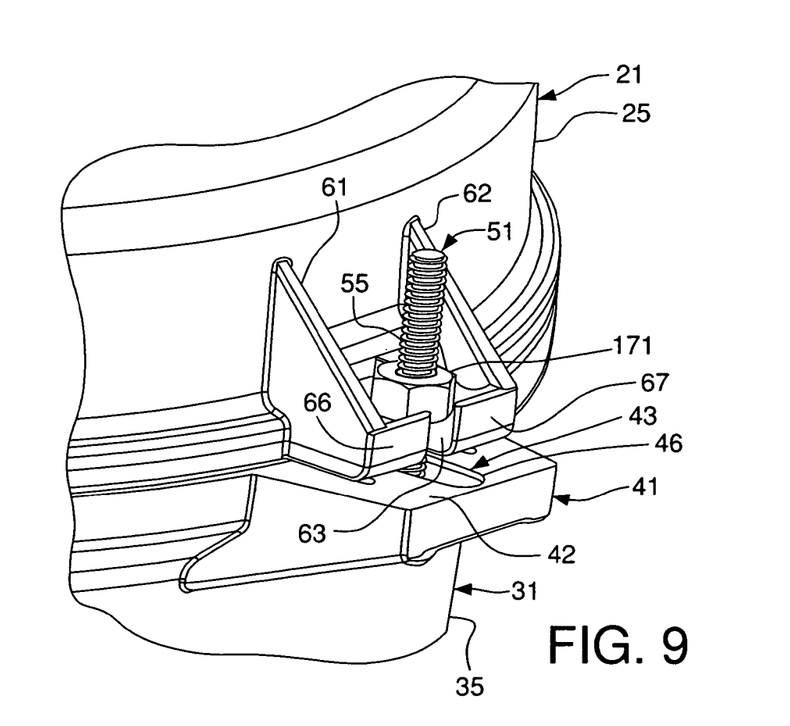
FIG. 9 is a perspective view of a locking assembly securing a lid to a body of the housing in which a hex nut is threadably received on a fastener.
Figure 10:
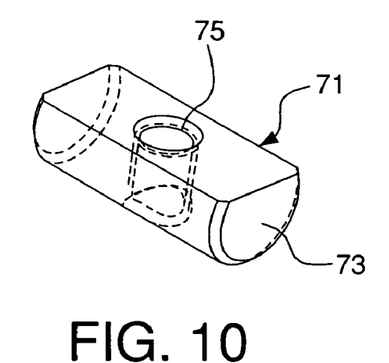
FIG. 10 is a perspective view of a first barrel nut.
Figure 11:
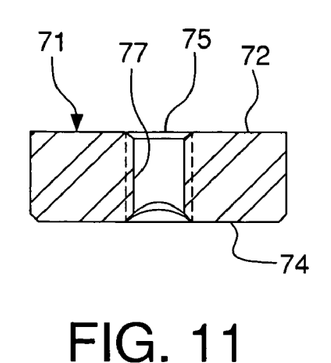
FIG. 11 is a front elevational view in cross section of the first barrel nut of FIG. 10.
Figure 12:
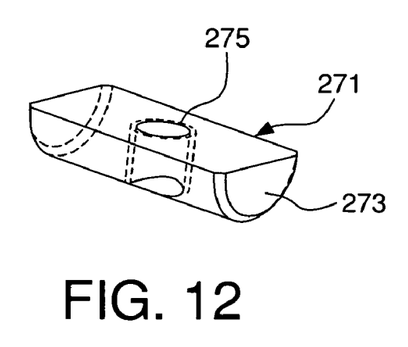
FIG. 12 is a perspectivew view of a second barrel nut.
Figure 13:
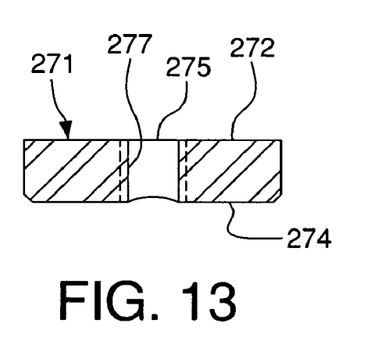
FIG. 13 is a front elevational view in cross section of the second barrel nut of FIG. 12.
Figure 14:
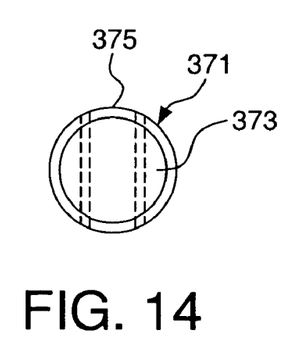
FIG. 14 a side elevational view of a third barrel nut.
Figure 15:
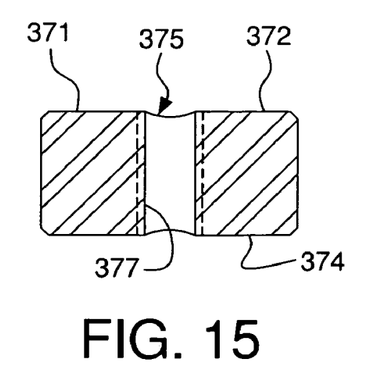
FIG. 15 is a side elevational view in cross section of the third barrel nut of FIG. 14.

Any suitable nut 71 may be used, such as those shown in FIGS. 9–15. A hex nut 171 is shown in FIG. 9. Various barrel nut designs are shown in FIGS. 10–15. FIGS. 1–8, 10 and 11 show a barrel nut 71 having an end profile 73 that is between semi-circular and circular. FIGS. 12 and 13 show a barrel nut 271 having a semi-circular end profile 273. FIGS. 14–15 show a barrel nut 371 that has a substantially circular end profile 373. The opening 75, 275 and 375 in the nut 71, 271 and 371 extends from an upper surface 72, 272 and 372 to a lower surface 74, 274 and 374 to receive the body portion 55 of the fastener 51. Preferably, the passageway 77, 277 and 377 formed between the upper and lower surfaces of the nut 71 is threaded to facilitate movement of the nut along the body portion of the fastener 51.

Figure 2:
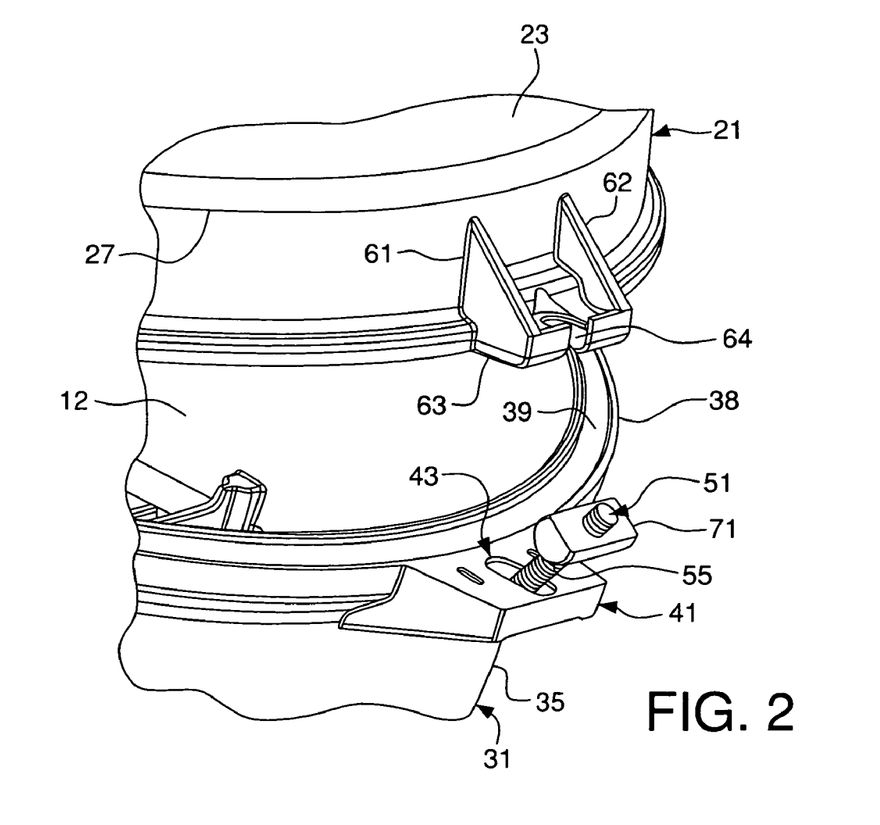
FIG. 2 is an perspective view of the locking assembly of the present invention showing the fastener secured to the body before being received by a slot in the lid.
Figure 3:
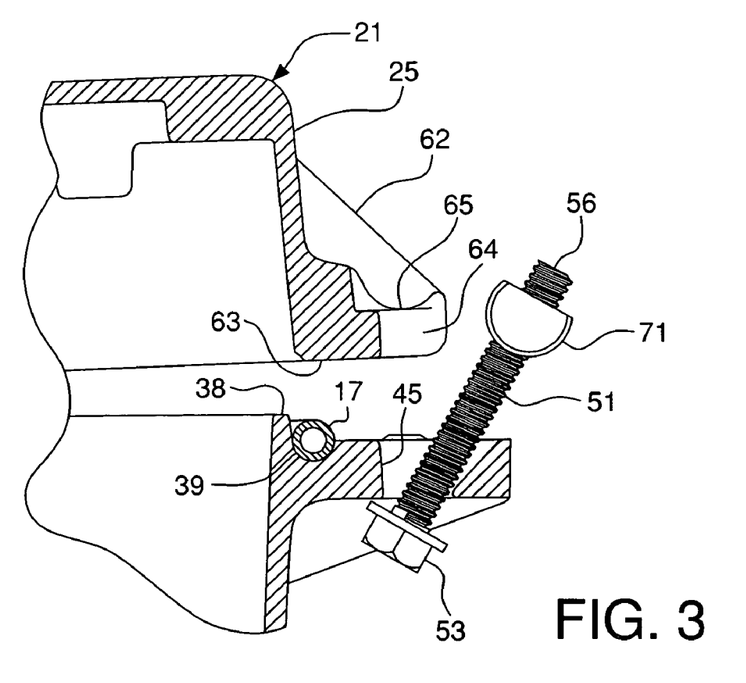
FIG. 3 is an elevational view in cross section of the locking assembly of FIG. 2.
Figure 4:
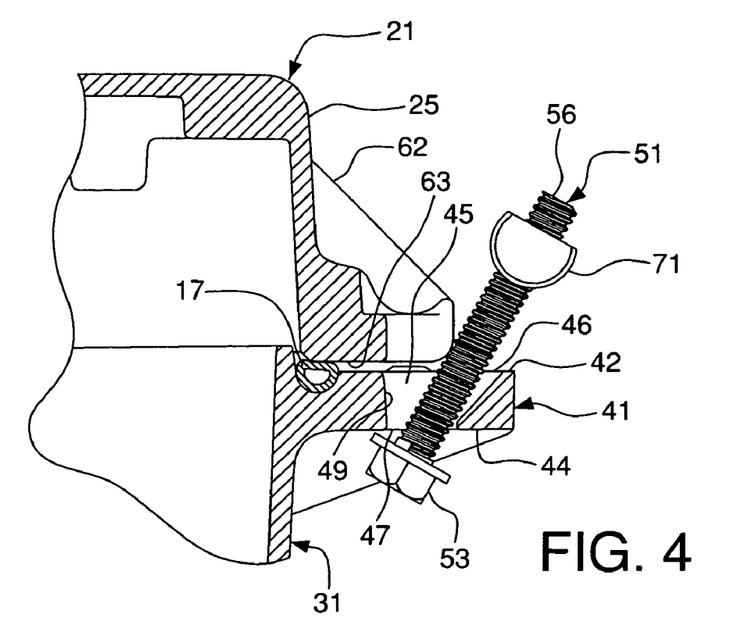
FIG. 4 is an elevational view in cross section of the locking assembly in which the lid has been pulled down onto the body of the housing.

A first ear 61 and a second ear 62 extend outwardly from the second wall 25 of the lid 21, as shown in FIGS. 1–9. A third base 63 extends between the first and second ears, as shown in FIGS. 2–4, so that the first and second ears are on opposite sides of the third base. A slot 64 in the third base receives the body portion 55 of the fastener 51. Preferably, the slot 64 is U-shaped, as shown in FIG. 2. The nut 71 abuts an upper surface 65 of the third base 63 when the lid 21 is in the closed position, as shown in FIG. 8, to prevent further downward movement of the nut along the body portion 55 of the fastener. Preferably, the upper surface 65 of the third base 63 is contoured to facilitate reception of the nut 71, as shown in FIGS. 2 and 3. Front lips 66 and 67 extend upwardly from the third base 63 on either side of the slot 64 to capture the nut and prevent movement of the nut away from the second wall 25. of the lid 21.

A gasket 17 may be disposed in the groove 39 in the first end 38 of the first wall 35 to facilitate a watertight seal between the lid 21 and body 31 of the ballast tank housing 11. The gasket 17 is compressed by the lid 21 when the locking assembly 13 fastens the lid to the body 31 of the ballast tank housing 11, as shown in FIG. 8, thereby preventing moisture, dirt, dust and other foreign matter from entering the ballast tank housing.

Assembly and Disassembly

As shown in FIG. 1, the lid (splice box or mounting hood) 21 is securely fastened to the body 31 of the ballast tank housing 11 by the locking assembly 13 of the present invention. The lid 21 may be easily opened and pivoted away from the body 31 by disengaging the locking assembly 13, as shown in FIG. 2.

The fastener 51 is inserted upwardly through the opening 43 in the tab 41 of the body 31 of the ballast tank housing 11, as shown in FIG. 3. The body portion 55 of the fastener 51 is inserted through the lower opening 47 in the lower surface 44 of the tab 41, and pushed upwardly through the passageway 45, thereby causing the body portion of the fastener to protrude from the upper opening 46 in the upper surface 42 of the tab. The fastener 51 is pushed upwardly through the opening 43 until the head member 53 prevents further upward movement of the fastener through the tab 41.

A nut 71 is disposed on the body portion 55 of the fastener 51 to prevent the fastener from being removed downwardly through the opening 43 in the tab 41, as shown in FIG. 3. The nut 71 has an opening 73 that is threadably received by the threaded body portion 55 of the fastener. The nut 71 is larger than the upper opening 46 in the upper surface 42 of the tab, thereby preventing the fastener from being removed through the opening 43 in the tab. Preferably, the nut 71 is positioned adjacent a distal end 56 of the body portion 55 of the fastener 51 to facilitate pivoting the fastener into the slot 64 of the third base 63. The threads behind the nut 71 adjacent the distal end 56 of the body portion 55 of the fastener 51 may be slightly deformed once the nut is disposed on the fastener to prevent accidental loosening of the nut from the bolt. The thread deformation is only slight so that the nut 71 may still be removed from the fastener 51 when desired.

The gasket 17 is disposed in the groove 39 in the first end 38 of the body 31 of the ballast tank housing, as shown in FIG. 3. The fastener 51 is pivoted outwardly away from the body 31 to bring the lid 21 down onto the body 31, thereby compressing the gasket 17 between the lid and the body, as shown in FIG. 4. The tapered portion 48 of the passageway 45 allows the fastener 41 to be pivoted outwardly to prevent interfering with closing the lid 21.

Figure 5:
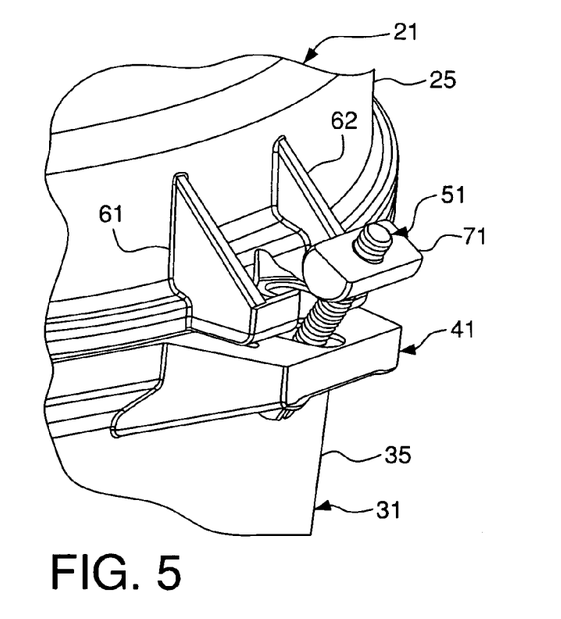
FIG. 5 is a perspective view of the locking assembly in which the lid has been pulled down onto the body of the housing.

The fastener 51 is pushed upwardly along the tapered portion 48 of the passageway 45 until the head member abuts the lower surface 44 of the tab 41, as shown in FIG. 4. The fastener 51 is then pivoted inwardly toward the lid 21 and into slot 64 in the third base 63 between first and second ears 61 and 62 until the fastener is substantially vertical, as shown in FIGS. 4, 5 and 6. The fastener 51 is then allowed to drop due to gravity or pushed downwardly until the nut 71 abuts the contoured upper surface 65 of the third base 63. The head member 53 of the fastener 51 is adapted to receive a rotating device. The rotating device is a standard tool, such as a socket wrench or screwdriver. The rotating device is used to thread the fastener 51 upwardly through the nut 71 until the head member 53 is adjacent, or engages, the lower surface 44 of the tab 41 and the nut 71 is adjacent, or engages, the upper surface 65 of the third base 63, as shown in FIGS. 7 and 8, thereby fastening and sealing the lid 21 to the body 31 of the ballast tank housing 11.

A standard tool, such as a socket wrench or a screwdriver, may be used to thread the fastener 51 downwardly through the nut 71 to move the head member 53 away from the lower surface 44 of the tab 41, thereby allowing the fastener to be pivoted out of the slot 64 in the third base 63 of the lid 21. Once the fastener 51 has been pivoted out of engagement with the third base 63, the lid 21 may be pivoted upwardly about pivotal member 15 to access the cavity 12 of the ballast tank housing 11. The above steps may then be repeated to again fasten and seal the lid 21 to the body 31 of the ballast tank housing 11.

While advantageous embodiments have been chosen to illustrate the invention, it will be understood by those skilled in the art that various changes and modifications may be made therein without departing from the scope of the invention as defined in the appended claims.

What is claimed is:

1. A locking assembly for a ballast housing, comprising:
   a body having a first base and a first wall extending upwardly from said first base;
   a lid having a second base and a second wall extending downwardly from said second base;
   a tab extending outwardly from said first wall and having an opening therein;
   a fastener pivotally disposed in said opening in said tab and having a head adapted to receive a rotating device;
   a third base extending outwardly from second wall;
   a slot in said third base adapted to receive said fastener; and
   a nut threadably disposed on said fastener, said fastener being rotatable through said nut to engage said fastener head with said tab and to engage said nut with said third base to tightly secure said lid to said body.

2. A locking assembly for a ballast housing according to claim 1, wherein
   first and second ears extend outwardly from said second wall on opposite sides of said third base.

3. A locking assembly for a ballast housing according to claim 1, wherein
   an upper surface of said third base is contoured to facilitate reception of said nut.

4. A locking assembly for a ballast housing according to claim 1, wherein
   a pivotal connection opposite said tab and said third base pivotally connects said body and said lid.

5. A locking assembly for a ballast housing according to claim 4, wherein
   said pivotal connection is a hinge.

6. A locking assembly for a ballast housing according to claim 1, wherein
   said slot is substantially U-shaped.

7. A locking assembly for a ballast housing according to claim 1, wherein
   said nut is a barrel nut.

8. A locking assembly for a ballast housing according to claim 1, wherein
said nut is a hex nut.
9. A locking assembly for a ballast housing according to claim 1, wherein
said tab has an upper surface and a lower surface, and said opening extends from said upper surface to said lower surface.
10. A locking assembly for a ballast housing according to claim 9, wherein
said opening has an inner wall, at least a portion of said inner wall of said opening tapers inwardly from said upper surface to said lower surface.
11. A locking assembly for a ballast housing according to claim 10, wherein
said inner wall tapers at an angle of about 25 degrees.
12. A locking assembly for a ballast housing according to claim 1, wherein
a gasket is positioned in a groove adjacent a first end of said first wall to facilitate a tight seal between said body and said lid of said housing.
13. A locking assembly for a ballast housing, comprising:
a body having a first base and a first wall extending upwardly from said first base;
a lid having a second base and a second wall extending downwardly from said second base;
a tab extending outwardly from said first wall and having an upper surface, a lower surface, a passageway connecting a first opening in said upper surface and a second opening in said lower surface;
a fastener pivotally received in said passageway in said tab and having a head adapted to receive a rotating device;
at least a portion of an inner wall of said passageway tapering inwardly from said first opening to said second opening;
first and second ears extending outwardly from said second wall, and a third base extending between said first and second ears;
a slot in said third base adapted to receive said fastener; and
a nut threadably disposed on said fastener, said fastener being rotatable through said nut to engage said fastener head with said tab and to engage said nut with said third base to tightly secure said lid to said body.
14. A locking assembly for a ballast housing according to claim 13, wherein
a pivotal connection opposite said tab and said third base pivotally connects said body and said lid.
15. A locking assembly for a ballast housing according to claim 14, wherein
said pivotal connection is a hinge.
16. A locking assembly for a ballast housing according to claim 13, wherein
said slot is substantially U-shaped.
17. A locking assembly for a ballast housing according to claim 13, wherein
said nut is a barrel nut.
18. A locking assembly for a ballast housing according to claim 13, wherein
said nut is a hex nut.
19. A locking assembly for a ballast housing according to claim 13, wherein
a gasket is positioned in a groove adjacent a first end of said first wall to facilitate a tight seal between said body and said lid of said housing.

20. A locking assembly for a ballast housing according to claim 13, wherein
said inner wall tapers at an angle of about 25 degrees.
21. A locking assembly for a ballast housing according to claim 13, wherein
an upper surface of said third base is contoured to facilitate reception of said nut.
22. A locking assembly for a ballast housing, comprising:
a body having a first base and a first wall extending upwardly from said first base;
a lid having a second base and a second wall extending downwardly from said second base;
a pivotal member connecting said lid to said body;
a tab extending outwardly from said first wall and having an upper surface and a lower surface, a passageway connecting a first opening in said upper surface and a second opening in said lower surface, said tab being opposite said pivotal connection between said body and said lid;
a fastener pivotally received in said passageway in said tab and having a head adapted to receive a rotating device;
at least a portion of an inner wall of said passageway tapering inwardly from said first opening to said second opening;
first and second ears extending outwardly from said second wall, and a third base extending between said first and second ears, said first and second ears being opposite said pivotal connection between said body and said lid;
a substantially U-shaped slot in said third base adapted to receive said fastener; and
a nut threadably disposed on said fastener, said fastener being rotatable through said nut to engage said fastener head with said tab and to engage said nut with said third base to tightly secure said lid to said body; and
a gasket positioned in a groove adjacent a first end of said first wall to facilitate a tight seal between said body and said lid of said housing.
23. A locking assembly for a ballast housing according to claim 22, wherein
said pivotal member is a hinge.
24. A locking assembly for a ballast housing according to claim 22, wherein
said nut is a barrel nut.
25. A locking assembly for a ballast housing according to claim 22, wherein
said nut is a hex nut.
26. A locking assembly for a ballast housing according to claim 22, wherein
said inner wall tapers at an angle of about 25 degrees.
27. A locking assembly for a ballast housing according to claim 22, wherein
an upper surface of said third base is contoured to facilitate reception of said nut.
28. A locking assembly, comprising:
a first portion;
a second portion;
a tab extending outwardly from said first portion and having an opening therein;
a fastener pivotally disposed in said opening in said tab and having a head adapted to receive a rotating device;
a base extending outwardly from second portion;
a slot in said base adapted to receive said fastener; and
a nut threadably disposed on said fastener, said fastener being rotatable through said nut to engage said fastener head with said tab and to engage said nut with said base to tightly secure said second portion to said first portion.

29. A locking assembly according to claim 28, wherein first and second ears extend outwardly from said second portion on opposite sides of said base.

30. A locking assembly according to claim 28, wherein an upper surface of said base is contoured to facilitate reception of said nut.

31. A locking assembly according to claim 28, wherein said slot is substantially U-shaped.

32. A locking assembly according to claim 28, wherein said nut is a barrel nut.

33. A locking assembly according to claim 28, wherein said nut is a hex nut.

34. A locking assembly according to claim 28, wherein said tab has an upper surface and a lower surface, and said opening extends from said upper surface to said lower surface.

35. A locking assembly according to claim 34, wherein said opening has an inner wall, at least a portion of said inner wall of said opening tapers inwardly from said upper surface to said lower surface.

36. A locking assembly according to claim 35, wherein said inner wall tapers at an angle of about 25 degrees.

\* \* \* \* \*